US010347190B2

(12) United States Patent
Chen

(10) Patent No.: US 10,347,190 B2
(45) Date of Patent: Jul. 9, 2019

(54) GOA DRIVING CIRCUIT

(71) Applicant: Shenzhen China Star Optoelectronics Technology Co., Ltd., Shenzhen, Guangdong (CN)

(72) Inventor: Shuai Chen, Guangdong (CN)

(73) Assignee: Shenzhen China Star Optoelectronics Technology Co., Ltd, Shenzhen (CN)

( * ) Notice: Subject to any disclaimer, the term of this patent is extended or adjusted under 35 U.S.C. 154(b) by 133 days.

(21) Appl. No.: 15/328,963

(22) PCT Filed: Jan. 11, 2017

(86) PCT No.: PCT/CN2017/070852
§ 371 (c)(1),
(2) Date: Nov. 9, 2017

(87) PCT Pub. No.: WO2018/040477
PCT Pub. Date: Mar. 8, 2018

(65) Prior Publication Data
US 2018/0336837 A1 Nov. 22, 2018

(30) Foreign Application Priority Data

Aug. 31, 2016 (CN) .......................... 2016 1 0796866

(51) Int. Cl.
*G09G 3/34* (2006.01)
*H01L 33/00* (2010.01)
(Continued)

(52) U.S. Cl.
CPC ............. *G09G 3/34* (2013.01); *G09G 3/3677* (2013.01); *G11C 19/28* (2013.01); *H01L 33/00* (2013.01);
(Continued)

(58) Field of Classification Search
CPC ............ G09G 3/34; G09G 3/36; G09G 3/367; G09G 3/3674; G09G 3/3677;
(Continued)

(56) References Cited

U.S. PATENT DOCUMENTS

2007/0192659 A1 8/2007 Kang et al.
2007/0274433 A1* 11/2007 Tobita .................. G09G 3/3677
377/64

(Continued)

FOREIGN PATENT DOCUMENTS

CN 103559912 A 2/2014
CN 103680386 A 3/2014
(Continued)

OTHER PUBLICATIONS

International Search Report dated May 3, 2017 for International Patent Application No. PCT/CN2017/070852.
(Continued)

*Primary Examiner* — Jason Crawford

(57) ABSTRACT

A GOA driving circuit is disclosed. The GOA driving circuit includes download units. Each of the download units includes a download transistor and a voltage stabilization capacitor. One plate of the voltage stabilization capacitor is connected to a source of the download transistor, and the other plate of the voltage stabilization capacitor is connected to a common electrode. The common electrode transmits a direct current voltage signal. The voltage stabilization capacitor generates a coupling voltage so as to maintain stabilization of the download signal. A reliability of signals of key nodes in the driving circuit can be improved, and a display stability of a liquid crystal panel can be improved accordingly.

11 Claims, 4 Drawing Sheets

(51) Int. Cl.
    *G09G 3/36*     (2006.01)
    *G11C 19/28*    (2006.01)
(52) U.S. Cl.
    CPC ............... *G09G 2300/0408* (2013.01); *G09G 2310/0286* (2013.01)
(58) Field of Classification Search
    CPC ....... G09G 2300/04; G09G 2300/0404; G09G 2300/0408
    See application file for complete search history.

(56) References Cited

U.S. PATENT DOCUMENTS

| | | | | |
|---|---|---|---|---|
| 2014/0093028 | A1* | 4/2014 | Wu | G11C 19/28 377/64 |
| 2016/0247455 | A1* | 8/2016 | Cao | G11C 19/287 |
| 2017/0084240 | A1* | 3/2017 | Dai | G09G 3/3677 |
| 2017/0330633 | A1* | 11/2017 | Sun | G09G 1/02 |
| 2018/0096732 | A1* | 4/2018 | Cheng | G11C 19/28 |
| 2018/0190223 | A1* | 7/2018 | Zeng | G09G 3/3648 |
| 2018/0268768 | A1* | 9/2018 | Lv | G11C 19/28 |

FOREIGN PATENT DOCUMENTS

| | | |
|---|---|---|
| CN | 103680453 A | 3/2014 |
| CN | 104008741 A | 8/2014 |
| CN | 104992946 A | 10/2015 |
| CN | 105139815 A | 12/2015 |
| CN | 105469767 A | 4/2016 |
| CN | 105590612 A | 5/2016 |
| CN | 105761758 A | 7/2016 |
| CN | 106251817 A | 12/2016 |
| TW | 200919476 A | 5/2009 |

OTHER PUBLICATIONS

Chinese Office Action dated May 28, 2018 for Chinese Patent Application No. 201610796866.7.

\* cited by examiner

GOA DRIVING CIRCUIT

CROSS-REFERENCE TO RELATED APPLICATIONS

This application claims the priority of Chinese patent application CN 201610796866.7, entitled "GOA driving Circuit" and filed on Aug. 31, 2016, the entirety of which is incorporated herein by reference.

FIELD OF THE INVENTION

The present disclosure relates to the technical field of liquid crystal display, and particularly to a GOA driving circuit.

BACKGROUND OF THE INVENTION

A GOA (Gate Driver on Array) driving circuit is formed by integrating a gate driving circuit of a TFT LCD on a glass substrate so that scanning driving of a liquid crystal display panel can be formed. Compared with a traditional driving technology utilizing a COF, according to a GOA driving technology, a manufacturing cost can be substantially saved, and a Bonging procedure of the COF at the Gate side can be saved, which is beneficial to productivity improvement thereof.

FIG. 1 schematically shows a structure of one stage of driving modules of the GOA driving circuit in the prior art, and each stage of GOA driving modules is used for driving a row of pixel units. As shown in FIG. 1, the GOA driving module comprises a pull-up control unit 110, mainly used for pre-charging on Q(N), a pull-up unit 120, mainly used for pulling up an electric potential of G(N) and outputting a line scanning signal, a pull-down unit 130, mainly used for pulling down an electric potential of Q(N) and G(N) to Vss, and a pull-down maintaining unit 140, mainly used for controlling the electric potential of the Q(N) and the G(N) to be unchanged at Vss. Multiple stages of GOA driving modules are cascaded to form the GOA driving circuit, and two adjacent stages of GOA driving modules are driven by clock signals which have a same frequency and an opposite phase.

FIG. 2 is a time sequence diagram of the GOA driving circuit during operation in the prior art. As shown in FIG. 2, CK/XCK is a clock triggering signal, Vss is a direct current source, G(N) is a row scanning output signal, and Q(N) is a pre-charge point electric potential signal. In the GOA circuit, the existence of various parasitic capacitance results in different degrees of periodic fluctuation of signals in the circuit. The function of the pull-down maintaining unit is to reduce signal abnormity caused by a capacitance coupling effect through the voltage stabilization effect of the direct current source.

It is an urgent problem to be solved in the GOA driving circuit design to enable the voltages of key circuit nodes in the GOA driving circuit to be free from influence and be reliably maintained at a design value point. The present disclosure provides a solution for the problem.

SUMMARY OF THE INVENTION

One of the technical problems to be solved by the present disclosure is to provide a GOA driving circuit in which the voltages of key circuit nodes is not influenced and can be reliably maintained at a design value point.

In order to solve the above problem, one embodiment of the present disclosure provides a GOA driving circuit. The GOA driving circuit comprises multiple stages of GOA driving modules. Each stage of GOA driving module is used for driving a row of pixel units, and two adjacent stages of GOA driving modules are driven by clock signals which have a same frequency and an opposite phase. Each of the GOA driving modules comprises a pull-up control unit, a pull-up unit, a pull-down unit, a pull-down maintaining unit and a download unit. The download unit comprises: a download transistor, a drain and a gate thereof are respectively connected in parallel to a clock signal input end and a control signal input end of the pull-up unit, whereby a download signal acting on a next stage of driving module is generated under an effect of a clock signal and a control signal, and a source thereof serves as a download signal output end; and a voltage stabilization capacitor, one plate thereof is connected to the source of the download transistor, and the other plate thereof is connected to a common electrode. The common electrode transmits a direct current voltage signal, and the voltage stabilization capacitor generates a coupling voltage so as to maintain stabilization of the download signal.

Preferably, coupling voltages generated by the voltage stabilization capacitors of two adjacent stages of download units have an opposite phase.

Preferably, a capacitance of the voltage stabilization capacitor is in a range from 1 pf to 100 pf.

The embodiment of the present disclosure provides another GOA driving circuit. The GOA driving circuit comprises multiple stages of GOA driving modules. Each stage of GOA driving module is used for driving a row of pixel units, and two adjacent stages of GOA driving modules are driven by clock signals which have a same frequency and an opposite phase. Each of the GOA driving modules comprises a pull-up control unit, a pull-up unit, a pull-down unit, a pull-down maintaining unit and a download unit. The download unit comprises: a download transistor, a drain and a gate thereof are respectively connected in parallel to a clock signal input end and a control signal input end of the pull-up unit, whereby a download signal acting on a next stage of driving module is generated under an effect of a clock signal and a control signal, and a source thereof serves as a download signal output end; a voltage stabilization capacitor, one plate thereof is connected to the source of the download transistor, and the other plates of two adjacent stages of voltage stabilization capacitors are respectively connected to a first voltage stabilization signal line and a second voltage stabilization signal line in a spacing manner. The first voltage stabilization signal line and the second voltage stabilization signal line both transmit an alternating current voltage signal, and the voltage stabilization capacitor generates a coupling voltage so as to maintain stabilization of the download signal.

Preferably, the alternating current voltage signal and the corresponding download signal have a same frequency and an opposite phase.

Preferably, the alternating current voltage signals transmitted by e first voltage stabilization signal line and the second voltage stabilization signal line have a same frequency and an opposite phase.

Preferably, the coupling voltages generated by the voltage stabilization capacitors of two adjacent stages of download units have an opposite phase.

Preferably, a maximum voltage value and a minimum voltage value of the alternating current voltage signals transmitted by the first voltage stabilization signal line and the second voltage stabilization signal line are respectively regulated according to interference conditions of an actual circuit.

Preferably, the first voltage stabilization signal line and the second voltage stabilization signal line are arranged on a first metal layer or a second metal layer.

Preferably, a capacitance of the voltage stabilization capacitor is in a range from 1 pf to 100 pf.

Compared with the prior art, one embodiment or more embodiments of the present disclosure can have the following advantages.

The reliability of signal of key nodes in the driving circuit can be improved and the display stability of a liquid crystal display panel can be improved by generating and outputting a download signal and carrying out voltage stabilization based on potential periodic fluctuation of the download signal.

Other advantages, objectives and features of the present disclosure will be further explained in the following description, and become self-evident for those skilled in the art based on investigation and study of what follows to some extent, or will be understood in practice of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 3:
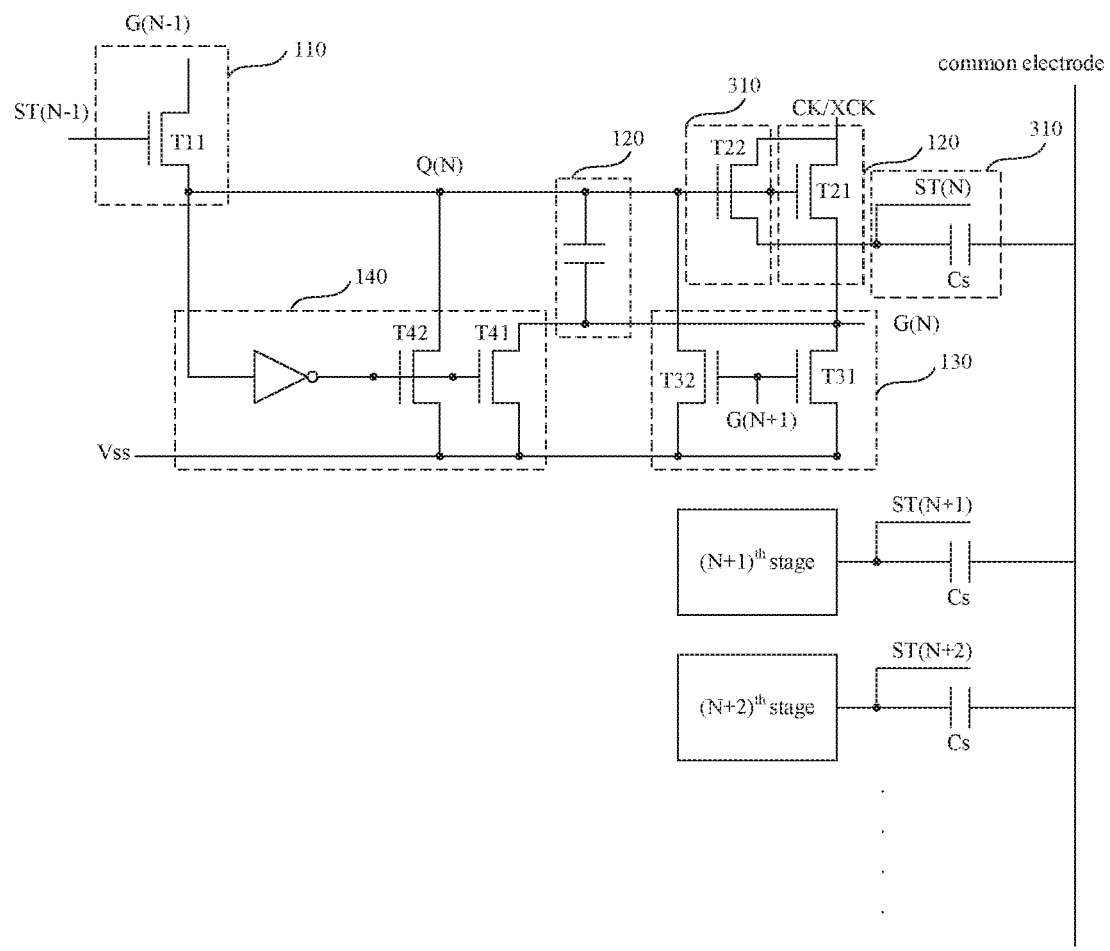
FIG. 3 schematically shows a structure of a GOA driving circuit according to one embodiment of the present disclosure.

FIG. 3 schematically shows a stricture of a GOA driving circuit according to one embodiment of the present disclosure. As shown in FIG. 3, the GOA driving circuit comprises multiple stages of GOA driving modules. Each stage of GOA driving module is used for driving a row of pixel units. Two adjacent stages of GOA driving modules are driven by clock signals which have a same frequency and an opposite phase. Each GOA driving module specifically comprises a pull-up control unit, a pull-up unit, a pull-down unit, a pull-down maintaining unit and a download unit 310. The download unit 310 comprises a download transistor T22 and a voltage stabilization capacitor Cs.

Specially, a drain and a gate of the download transistor T22 are respectively, connected in parallel to a clock signal input end (a drain of a transistor T21) and a control signal input end (a gate of the transistor T21) of the pull-up unit, whereby a download signal acting on a next stage of driving module is generated under an effect of a clock signal and a control signal. A source of the download transistor T22 serves as a download signal output end. The pull-up control unit of the $N^{th}$ stage of driving module is input with the download signal ST(N−1) generated by the $(N−1)^{th}$ stage of driving module, and the download signal of the $N^{th}$ stage of driving modules serves as an input signal of the pull-up control unit of the $(N+1)^{th}$ stage of driving module.

One plate of each voltage stabilization capacitor Cs is connected to the source of the download transistor T22, and the other plate of the voltage stabilization capacitor Cs is connected to a common electrode (Acom). The common electrode of a liquid crystal display panel transmits a direct current voltage signal, and the voltage stabilization capacitor Cs generates coupling voltages so as to maintain stabilization of the download signal.

Figure 1:
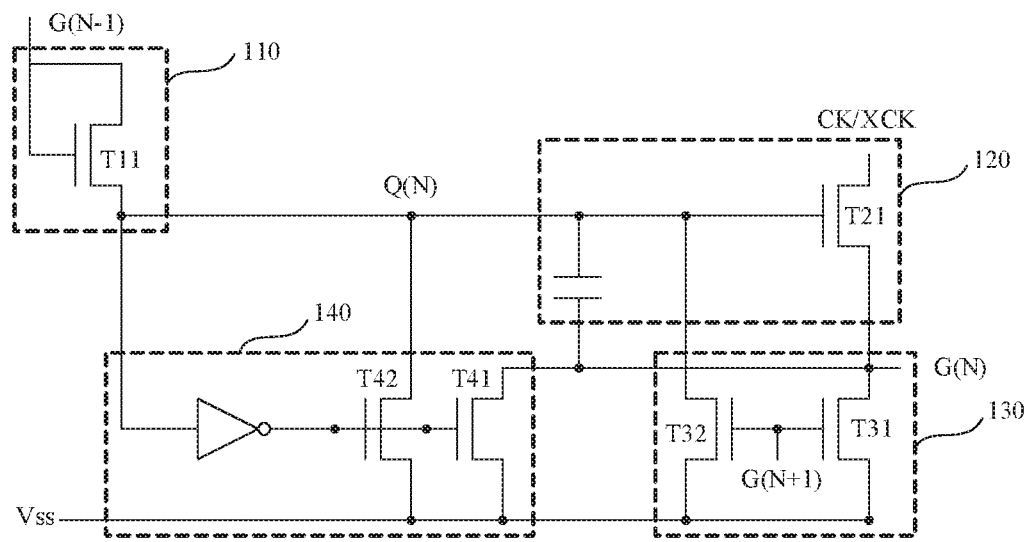
FIG. 1 schematically shows a structure of one stage of driving modules of a GOA driving circuit in the prior art.
Figure 2:
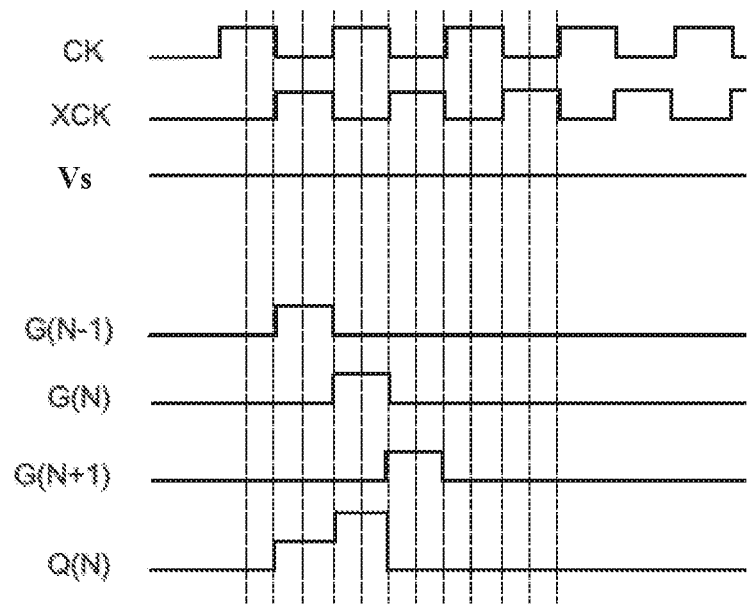
FIG. 2 shows a time sequence diagram of the GOA driving circuit during operation in the prior art.

In the prior art, a former stage of row scanning signal is generally used for turning on a later stage of driving module. Specially, as shown in FIG. 1, the gate of the transistor T11 of the pull-up unit is coupled to the drain thereof for receiving the former stage of row scanning signal G(N−1). It can be easily seen that, the transistor T11 is equivalent to a diode at the moment. That is, the gate source voltage Vgs of the transistor T11 is equal to 0. Consequently, a relatively high leakage current exists inside the transistor T11, thereby affecting the point voltage of Q(N).

In the embodiment of the present disclosure, the download transistor T22 is added for generating and outputting the download signal ST(N). A low electric potential of a download signal ST(N−1) is a low level of the clock signal CK (or XCK), which is −8V in general. A low electric potential of line scanning signals G(N−1) is Vss, which is −6V in general. Hence, the gate source voltage Vgs of T11 is less than 0. Therefore, the influence of leakage currents in the transistor on the same stage of Q(N) can be reduced by the download signal ST(N).

Figure 4:
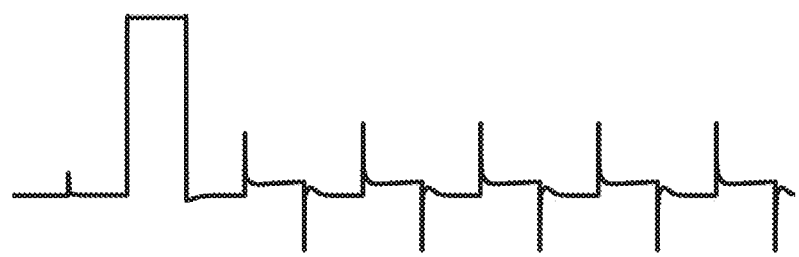
FIG. 4 shows a waveform of a download signal observed by an oscilloscope.

In addition, the download signal ST(N) vary to a certain degree due to existence of a capacitance coupling effect, and the varying condition of a single stage of signal is shown in FIG. 4. Due to periodic reversion of CK (or XCK) signal, the signal ST(N) periodically ripple, which would do harm to the control of a next stage of signal and has the risk of causing the abnormity of signal Q(N+1) and signal Vss.

Therefore, in the embodiments of the present disclosure, a voltage stabilization capacitor Cs is arranged in each stage of download unit 310. One plate of each voltage stabilization capacitor Cs is connected to a common electrode Acom. The common electrode Acorn transmits a direct current voltage signal and a coupling voltage can be generated through a coupling effect of the voltage stabilization capacitors Cs. The coupling voltage and the ripple of the download signal are superposed, whereby the ripple generated by the download signal can be partly offset. That is, the download signal can be stabilized, and signal variation thereof can be reduced.

Figure 5:
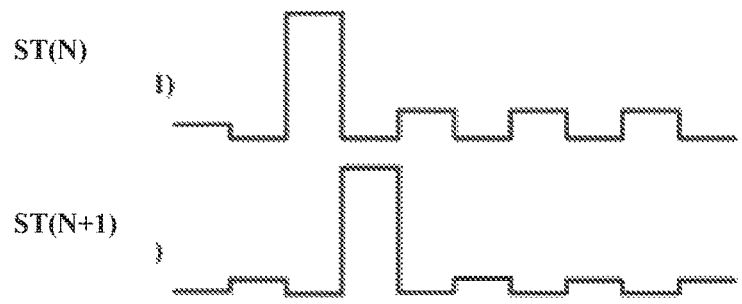
FIG. 5 shows a waveform of two adjacent stages of download signals according to an embodiment of the present disclosure.

Further, since each stage of download signal ST(N) is connected to the common electrode Acorn through the voltage stabilization capacitor Cs, the coupling voltages generated by the voltage stabilization capacitors Cs of the two adjacent stages of download units 310 have an opposite phase (as shown in FIG. 5). Therefore, an electric potential of the common electrode Acom will not be largely affected.

The capacitances of all voltage stabilization capacitors can be arranged equal to one another, or unequal to one another according to actual RC condition of a panel. The capacitance of the voltage stabilization capacitor Cs is generally in a range from 1 pf to 100 pf.

According to the embodiment of the present disclosure, the voltages of key nodes in the GOA driving circuit can be stabilized by the download unit 310, and thus a working reliability of the circuit can be improved. Meanwhile, additional wiring is not needed, thereby saving the design space of the panel.

Figure 6:
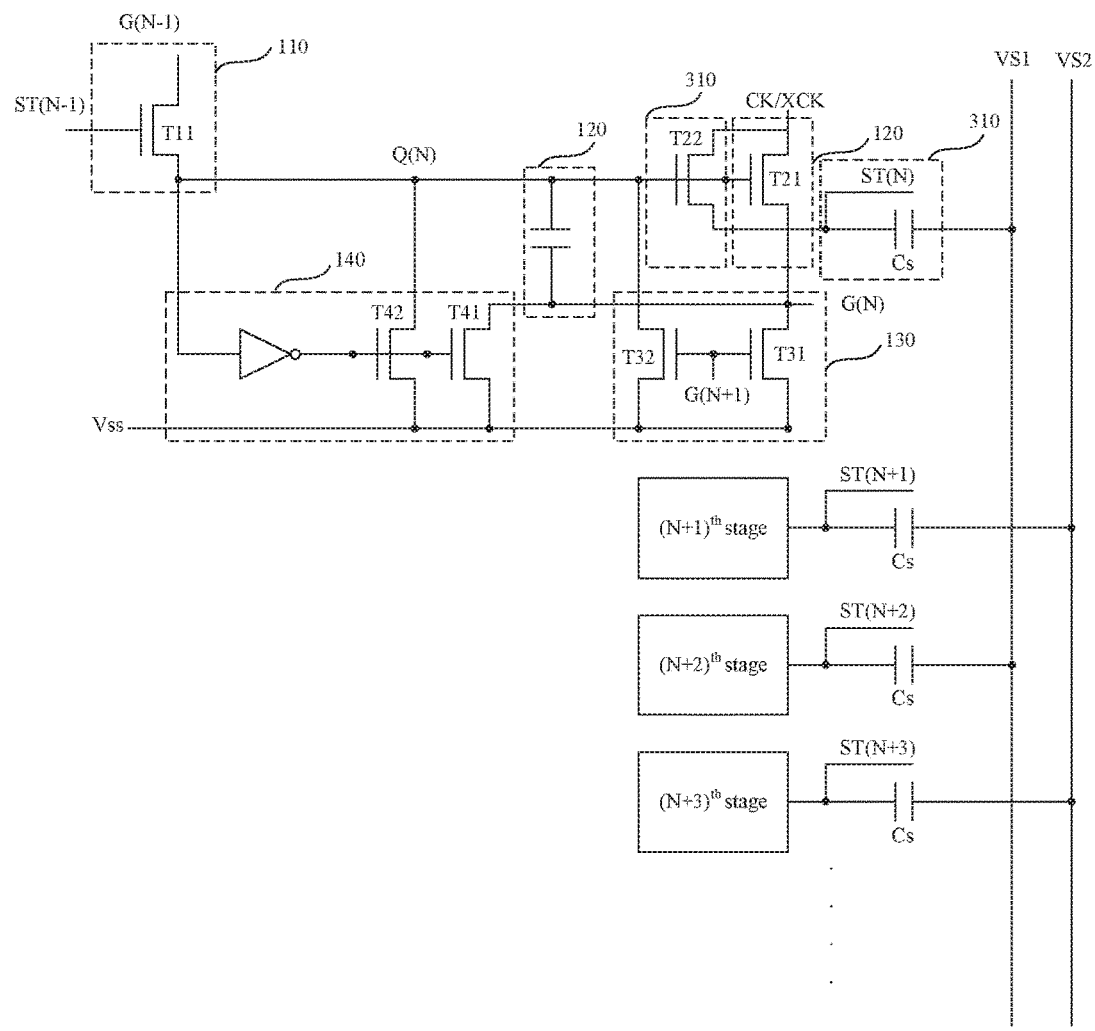
FIG. 6 schematically shows a structure of a GOA driving circuit according to another embodiment of the present disclosure.

FIG. 6 schematically shows a structure of a GOA driving circuit according to another embodiment of the present disclosure, and only parts different from the former embodiment are explained in the following.

In the embodiment, one plates of the voltage stabilization capacitors Cs are respectively connected to different voltage stabilization signal lines. As shown in FIG. 6, the $N^{th}$ stage of voltage stabilization capacitor Cs is connected to a first voltage stabilization signal line VS1; the $(N+1)^{th}$ stage of voltage stabilization capacitor Cs is connected to a second voltage stabilization signal line VS2; the $(N+2)^{th}$ stage of voltage stabilization capacitor Cs is connected to the first voltage stabilization signal line VS1; the $(N+3)^{th}$ stage of voltage stabilization capacitor Cs is connected to the second voltage stabilization signal line VS2, and so on. The voltage stabilization capacitors Cs are respectively connected to the first voltage stabilization signal line and the second voltage stabilization signal line in a spacing manner.

The first voltage stabilization signal line and the second voltage stabilization signal line can be arranged on a first metal layer or a second metal layer.

Figure 7:
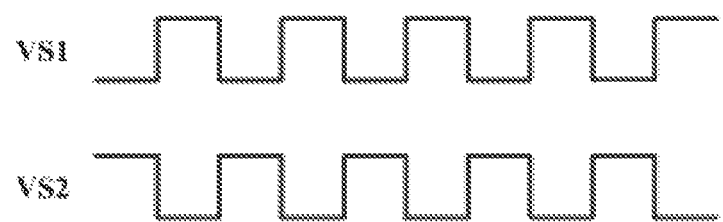
FIG. 7 shows a waveform of an alternating current voltage stabilization signal according to another embodiment of the present disclosure.

Further, the first voltage stabilization signal line VS1 and the second voltage stabilization signal line VS2 both transmit an alternating current voltage signal. As shown in FIG. 7, the alternating current voltage signals transmitted by the first voltage stabilization signal line and the second voltage stabilization signal line have a same frequency and an opposite phase. The coupling voltages generated by the voltage stabilization capacitors Cs of two adjacent stages of download units 310 have an opposite phase.

Figure 8:
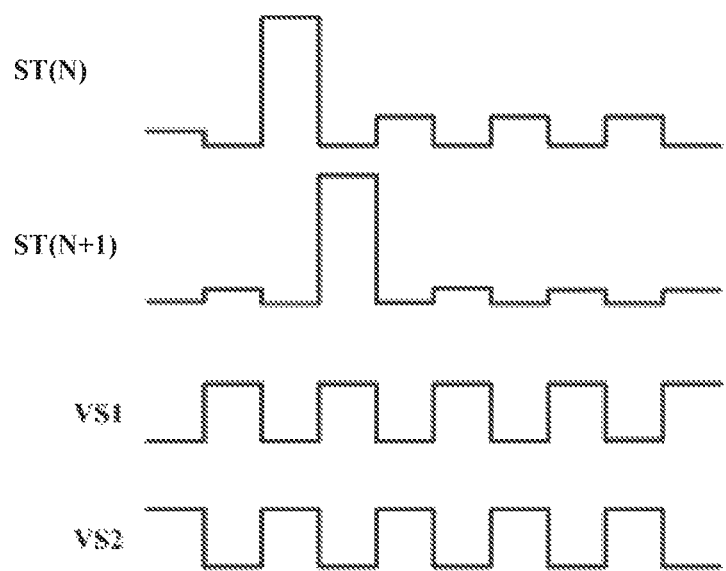
FIG. 8 shows a waveform of two adjacent stages of download signals and corresponding alternating current signals according to another embodiment of the present disclosure.

The alternating current voltage signal and the corresponding download signal have a same frequency and an opposite phase. FIG. 8 shows a waveform of two adjacent stages of download signals and corresponding alternating current signal, wherein a waveform VS1 is opposite to the capacitance coupling effect of the ST(N), and a waveform VS2 is opposite to the capacitance coupling effect of the ST(N+1). The two opposite capacitance coupling effects can be offset with each other so as to alleviate the periodic fluctuation of the download signal.

Further, a maximum voltage value and a minimum voltage value of alternating current voltage signals (VS1 and VS2) transmitted by the first voltage stabilization signal line and the second voltage stabilization signal line can be regulated according to interference conditions of an actual circuit. Further, the capacitance of the voltage stabilization capacitor Cs can also be regulated. When a period of the download signal changes, a period of the alternating current voltage signals (VS1 and VS2) can he regulated. Therefore, the debugging of the driving circuit is relatively flexible, and the practicability of circuit design is improved.

Similarly, the capacitances of all voltage stabilization capacitors can be arranged equal to one another, or unequal to one another according to actual RC condition of the panel. The capacitance of the voltage stabilization capacitor Cs is generally in a range from 1 pf to 100 pf.

In the GOA driving circuit of the embodiment of the present disclosure, the reliability of signals of key nodes in the driving circuit can be improved and the display stability of a liquid crystal panel can be improved by generating and outputting the download signal and carrying out voltage stabilization based on potential periodic fluctuation of the download signal.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A GOA driving circuit, comprising multiple stages of GOA driving modules,
    wherein each stage of GOA driving module is used for driving a row of pixel units, and two adjacent stages of GOA driving modules are driven by clock signals which have a same frequency and an opposite phase;
    wherein each of the GOA driving modules comprises a pull-up control unit, a pull-up unit, a pull-down unit, a pull-down maintaining unit and a download unit; and
    wherein the download unit comprises:
        a download transistor, a drain and a gate thereof are respectively connected in parallel to a clock signal input end and a control signal input end of the pull-up unit, whereby a download signal acting on a next stage of driving module is generated under an effect of a clock signal and a control signal, and a source thereof serves as a download signal output end; and
        a voltage stabilization capacitor, one plate thereof is connected to the source of the download transistor, and the other plate thereof is connected to a common electrode, wherein the common electrode transmits a direct current voltage signal, and the voltage stabilization capacitor generates a coupling voltage so as to maintain stabilization of the download signal.

2. The GOA driving circuit according to claim 1, wherein coupling voltages generated by the voltage stabilization capacitors of two adjacent stages of download units have an opposite phase.

3. The GOA driving circuit according to claim 2, wherein a capacitance of the voltage stabilization capacitor is in a range from 1 pf to 100 pf.

4. A GOA driving circuit, comprising multiple stages of GOA driving modules,
   wherein each stage of GOA driving module is used for driving a row of pixel units, and two adjacent stages of GOA driving modules are driven by clock signals which have a same frequency and an opposite phase;
   wherein each of the GOA driving modules comprises a pull-up control unit, a pull-up unit, a pull-down unit, a pull-down maintaining unit and a download unit; and
   wherein the download unit comprises:
      a download transistor, a drain and a gate thereof are respectively connected in parallel to a clock signal input end and a control signal input end of the pull-up unit, whereby a download signal acting on a next stage of driving module is generated under an effect of a clock signal and a control signal, and a source thereof serves as a download signal output end;
      a voltage stabilization capacitor, one plate thereof is connected to the source of the download transistor, and the other plates of two adjacent stages of voltage stabilization capacitors are respectively connected to a first voltage stabilization signal line and a second voltage stabilization signal line in a spacing manner, wherein the first voltage stabilization signal line and the second voltage stabilization signal line both transmit an alternating current voltage signal, and the voltage stabilization capacitor generates a coupling voltage so as to maintain stabilization of the download signal.

5. The GOA driving circuit according to claim 4, wherein the alternating current voltage signal and the corresponding download signal have a same frequency and an opposite phase.

6. The GOA driving circuit according to claim 5, wherein the alternating current voltage signals transmitted by the first voltage stabilization signal line and the second voltage stabilization signal line have a same frequency and an opposite phase.

7. The GOA driving circuit according to claim 6, wherein the coupling voltages generated by the voltage stabilization capacitors of two adjacent stages of download units have an opposite phase.

8. The GOA driving circuit according to claim 4, wherein a maximum voltage value and a minimum voltage value of the alternating current voltage signals transmitted by the first voltage stabilization signal line and the second voltage stabilization signal line are respectively regulated according to interference conditions of an actual circuit.

9. The GOA driving circuit according to claim 8, wherein the first voltage stabilization signal line and the second voltage stabilization signal line are arranged on a first metal layer or a second metal layer.

10. The GOA driving circuit according to claim 9, wherein a capacitance of the voltage stabilization capacitor is in a range from 1 pf to 100 pf.

11. The GOA driving circuit according to claim 4, wherein periods of alternating current voltage signals transmitted by the first voltage stabilization signal line and the second voltage stabilization signal line are respectively regulated according to interference conditions of an actual circuit.

* * * * *